United States Patent
Borgers et al.

(10) Patent No.: US 9,490,377 B2
(45) Date of Patent: Nov. 8, 2016

(54) USE OF A UNIFORM LAYER OF INSULATING MATERIAL IN BACK-CONTACT SOLAR CELLS

(75) Inventors: Tom Borgers, Leuven (BE); Jozef Szlufcik, Leuven (BE)

(73) Assignee: SOL IP S.A.R.L., Bertrange (LU)

( * ) Notice: Subject to any disclaimer, the term of this patent is extended or adjusted under 35 U.S.C. 154(b) by 511 days.

(21) Appl. No.: 13/883,326

(22) PCT Filed: Nov. 3, 2011

(86) PCT No.: PCT/EP2011/069298
§ 371 (c)(1),
(2), (4) Date: Aug. 20, 2013

(87) PCT Pub. No.: WO2012/059534
PCT Pub. Date: May 10, 2012

(65) Prior Publication Data
US 2013/0327390 A1    Dec. 12, 2013

(30) Foreign Application Priority Data

Nov. 5, 2010    (EP) .................................... 10190189

(51) Int. Cl.
*H01L 31/0224*    (2006.01)
*H01L 31/05*    (2014.01)

(52) U.S. Cl.
CPC . *H01L 31/02245* (2013.01); *H01L 31/022458* (2013.01); *H01L 31/0516* (2013.01); *Y02E 10/50* (2013.01)

(58) Field of Classification Search
CPC ... H01L 31/00; H01L 31/02; H01L 31/0203; H01L 31/0224; H01L 31/022425; H01L 31/022433; H01L 31/022441; H01L 31/02245; H01L 31/022458; H01L 31/04
See application file for complete search history.

(56) References Cited

U.S. PATENT DOCUMENTS

| | | | |
|---|---|---|---|
| 5,972,732 A | 10/1999 | Gee et al. | |
| 2008/0216887 A1 | 9/2008 | Hacke et al. | |
| 2008/0289682 A1* | 11/2008 | Adriani | H01L 31/048 136/251 |
| 2010/0012172 A1* | 1/2010 | Meakin | H01L 31/048 136/251 |
| 2012/0012180 A1 | 1/2012 | Abiko | |

FOREIGN PATENT DOCUMENTS

| | | |
|---|---|---|
| JP | 8 298334 A | 10/1999 |
| WO | 2010/027265 A2 | 3/2010 |
| WO | 2010/110083 A1 | 9/2010 |

OTHER PUBLICATIONS

International Search Report, dated Aug. 16, 2012, from corresponding PCT application.

* cited by examiner

*Primary Examiner* — Christina Chern
(74) *Attorney, Agent, or Firm* — Young & Thompson

(57) ABSTRACT

A uniform layer of insulating material is used to separate the connectors from the non-illuminated side of a back-contact solar cell, particularly a cell of the MWT type, the layer preferably being a uniform woven or non-woven fabric of a heat-resistant material such as glass fiber, and the electrical connection between the contact points of the cell and the connectors being made through the uniform layer thereby partially embedding the insulating material in the connection.

11 Claims, 9 Drawing Sheets

USE OF A UNIFORM LAYER OF INSULATING MATERIAL IN BACK-CONTACT SOLAR CELLS

FIELD OF THE INVENTION

The present invention is related to photovoltaic devices such as solar cells. More particularly it relates to means for connecting contact points of a cell to an external connector when the termination contact points to the two oppositely doped regions of the solar cells are placed on the non-illuminated surface of the solar cell.

TECHNOLOGICAL BACKGROUND

Most solar cells described in the prior art can be subdivided into several categories according to their general structure.

The most common solar cells, the so-called standard cells, have their oppositely doped regions on both sides of the cell, and metallization including busbars on the illuminated side. There has long been a desire in the solar cell industry to get away with busbars on the illuminated side, as they create important shadowing losses.

In the so called back-contact solar cells, both ohmic contacts to the two oppositely doped regions of the solar cells (i.e. both series of external connecting points, also called termination points) are placed on the back or non-illuminated surface of the solar cell. A back contact solar cell thus provides termination point to the positive and negative terminals at the backside of the cell. This concept enables to reduce shadowing losses.

Back-contact solar cells fall into three main categories (for a review paper, see Prog. Photovolt: Res. Appl. 2006; 14:107-123).

Interdigitated Back-Contact (IBC) cells include those cell designs which rely upon carrier collection at a rear junction alone; they require silicium of high purity.

Emitter Wrap-Through (EWT) cells have carrier collection at both sides and rely upon current conduction from the front to the back through a large number of closely spaced through hole or via's in the cell.

Metal Wrap-Through (MWT) cells have a structure that is most closely linked to the standard cell structure. In these cells, the emitter is located on the illuminated side, the busbars moved to the rear surface, leaving only a thin front surface grid on the illuminated surface that is connected to the rear surface by extending it through a small number of metallised openings (or vias) in the wafer. WO 98/54763 discloses MWT cells.

In all types of back-contact cells, the current is collected at contact points or areas, which are then soldered to copper strips called connectors or interconnectors, at least one connector being soldered to a series of negative contact points or areas and at least one other being soldered to a series of positive contact points.

When the connector passes over an area of opposite sign, there must be placed an insulating layer between them. The practical result is that holes must be provided in the insulating layer; the holes must be made in the insulating layer and the insulating layer must be placed over the non-illuminated side in such a way that the holes face the contact points, thus allowing making the electrical connection e.g. by soldering. The making of the holes and the aligning of the insulating layer are two difficult operations. There is thus a need to find an easier connection system, avoiding the need to make holes in the insulating layer.

AIM OF THE INVENTION

It is an aim of this invention to provide a method for producing a back-contact photovoltaic cell, which alleviates or avoids some problems of the prior art.

It is a particular aim of this invention to provide a method for electrically connecting a contact point to an interconnector without the need to make a hole in the insulating layer separating the connector from an area of opposite polarity surrounding the contact point.

Another aim of the invention is to provide a process that does not require any specific alignment of the insulating layer over the non-illuminated surface of the cell before electrically connecting the connectors with the contact points.

SUMMARY OF THE INVENTION

The invention provides back-contact solar cell wherein the contact points to the two oppositely doped regions of the solar cells are placed on the non-illuminated surface of the solar cell, comprising connectors to collect the current from the contact points, characterised in that the connectors are electrically connected to the contact points through a uniform layer of insulating material separating the connectors from the non-illuminated surface.

The invention also provides a process for connecting ohmic contacts of a back-contact solar cell to external connectors, comprising the steps of:

providing a solar cell wherein the contact points to the two oppositely doped regions are placed on its non-illuminated surface;

laying a uniform layer of insulating fabric material;

laying at least one electrical connector over one or more contact points of one polarity and at least one electrical connector over one or more contact points of the other polarity, each contact point facing an electrical connector, the electrical conductor being spatially separated by the fabric material from the non-illuminated surface including the contact points;

electrically connecting each contact point to the connector facing it through the layer of insulating material spatially separating them, the electrical connection embedding the fabric material.

The invention further provides for the use of a uniform layer of insulating material as solder-through insulating layer in back-contact solar cells.

DESCRIPTION OF THE FIGURES

The Figures relate to MWT-type back-contact cells, which are the preferred embodiment of the invention;

FIG. 1 shows the back (non-illuminated) side of a MWT-type back-contact cell having six rows of contact points.

FIG. 2 shows a cross section view through a contact point to the front surface grid on the illuminated surface.

FIG. 3 shows a cross-section view through a contact point to the back surface.

FIGS. 4 and 5 show the same cross-section views as respectively FIGS. 2 and 3 after application of two drops of solder paste on each contact point, according to an embodiment of the invention.

FIGS. 6 and 7 show the same cross-section views as respectively FIGS. 4 and 5 after laying a layer of woven glass fibre over the back side of the cell then a connector over the row of contact points.

FIGS. 8 and 9 show the same cross-section views as respectively FIGS. 6 and 7 after soldering.

FIG. 10 shows the same cross-section as FIG. 8 when using a connector with a thick solder layer.

FIG. 11 shows the back of the MWT-type back-contact cell after soldering.

DETAILED DESCRIPTION OF THE INVENTION

The invention is applicable to back-contact cells of all types, but particularly applicable to MWT cells and will thus be described with reference to such a cell. In this description, we will refer to the regions of opposite polarity as the first and the second region, the first region being on the illuminated side and the second on the back (non-illuminated) side.

Figure 1:
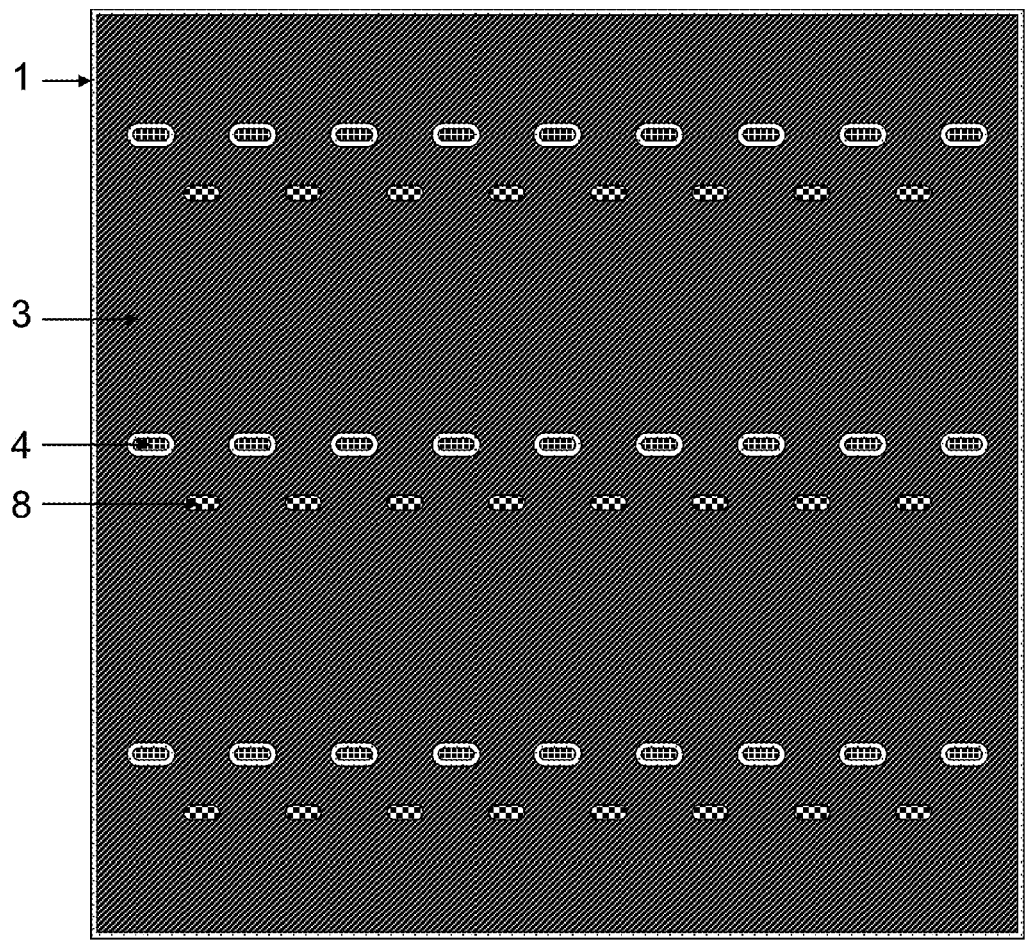
FIGS. 1 to 11 are only schematic, and the size of the elements has not been drawn to scale for illustrative purposes.

As shown on FIG. 1, the back side of the cell comprises on most of the surface of the wafer 1 an area 3, consisting of a metallic coating usually a non-solderable aluminium coating, and six rows of contact areas also called contact points having a rectangular shape with rounded ends. From the top of FIG. 1, the first, third and fifth rows are shown to comprise nine solderable contact points 4 to the first region, connected through one or more vias to the first region on the front (illuminated) side and surrounded by a groove in order to be electrically insulated from the second region which is at the interface between the substrate 1 and the metallic layer 3. The second, fourth and sixth rows are shown to comprise eight solderable contact points 8 to the second region.

Figure 2:
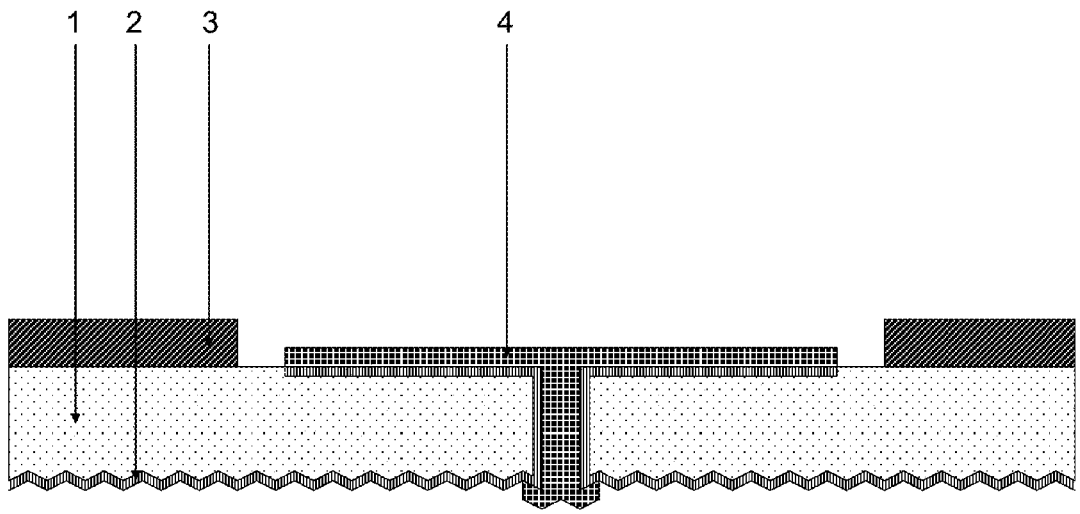

FIG. 2 shows a cross section view through a contact point 4 linked through one via to the first region on the illuminated surface 2. The contact point 4 is electrically insulated from the second region by a groove (not shown). Each contact point 4 could also be connected to the first region by means of more than one via.

Figure 3:
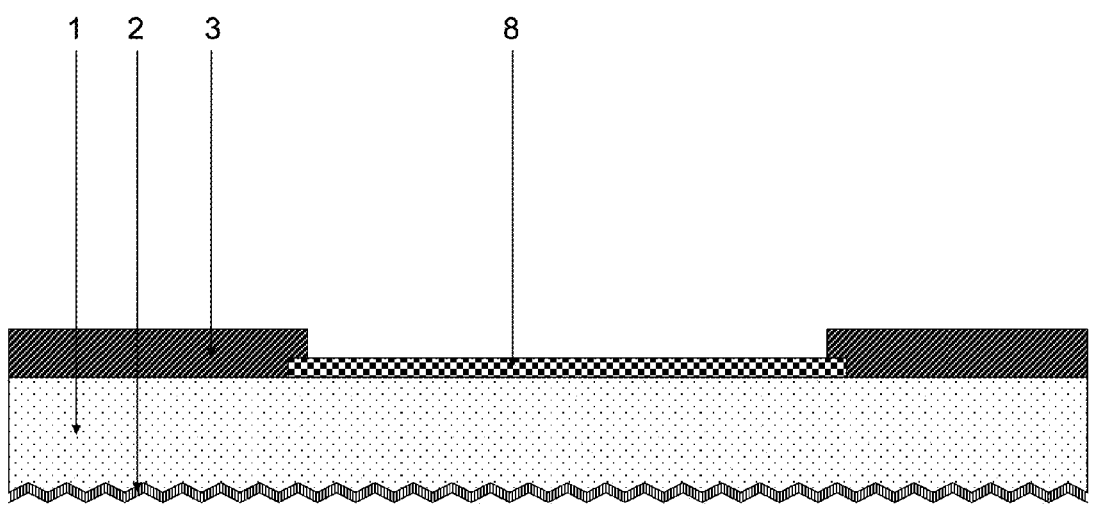

FIG. 3 shows a cross-section view through a contact point 8 to the second region.

Figure 4:
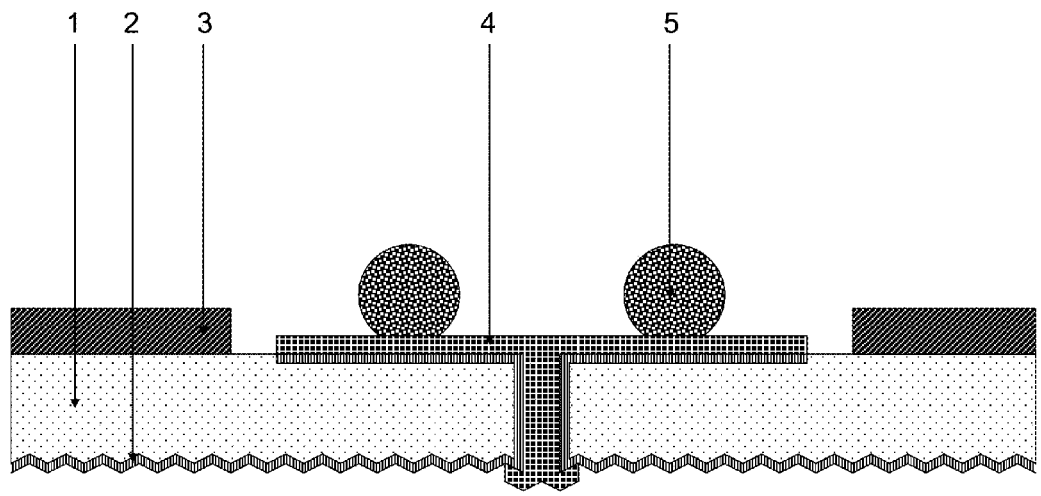
Figure 5:
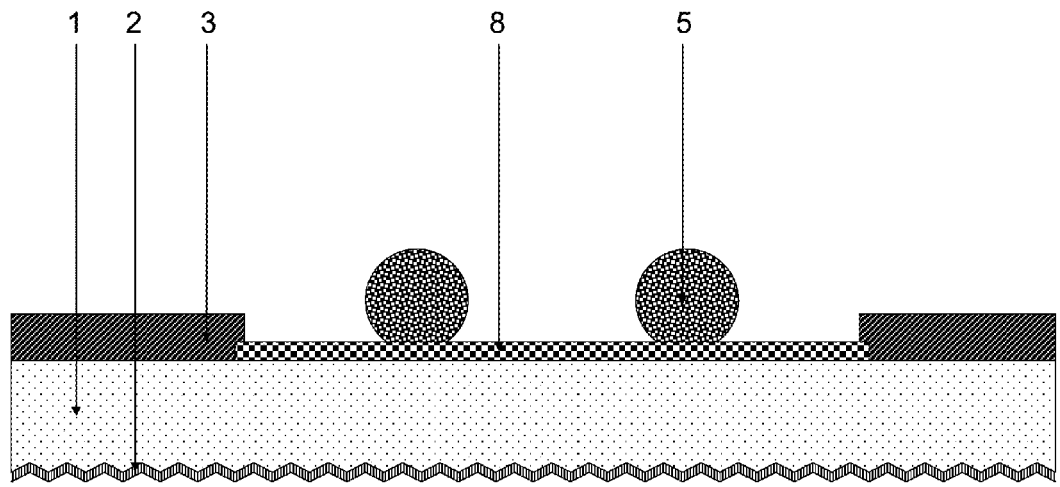

FIGS. 4 and 5 show the same cross-section views as respectively FIGS. 2 and 3 after application of two drops of solder paste 5 on each contact point, according to an embodiment of the invention. The number of drops is adapted to the shape of the contact points.

There is then applied on the back side of the cell, preferably over its entire surface, a uniform layer of woven or non-woven fabric made of electrically insulating material resistant to the temperature required for soldering (or curing) and for the later lamination (encapsulation) step.

As used herein, a uniform layer means a layer of woven or non-woven fabric that is uniform over the area of the cell where the contact points are located. Thus, no special openings are created in the fabric after its manufacture, and the invention relies on the use of the mesh openings in the woven or non-woven fabric. During the electrical connection step, the electrically connecting material passes through the mesh openings whilst the connector and the contact points remain spatially separated by the fabric; this results in the electrical connection embedding the fabric.

The fabric density could be different outside the cell area, e.g. lower to save on fabric material where it is not needed, or higher to contribute in hiding the elements located behind it.

No alignment of the insulating material is required since there is no pattern with openings made in the tissue to be placed opposite each contact point. The layer of insulating material can also be applied on several cells. This has the additional advantage that it will also cover the connectors in the space between the cells: this prevents undesired reflection of the sunlight by the connectors that otherwise requires some physical action such as coating the visible part of the connectors.

The preferred material forming the insulating layer is glass, because it combines all the desired properties: it is an inert material (already used in solar panels but for other purposes, thus known in the art to have the required long term resistance); it has excellent physical properties and will contribute to the dimensional stability of the modules; it has excellent electrical insulation properties; it has excellent chemical properties, being essentially inert (moisture-resistant, no outgassing) and fire-resistant; and it is relatively inexpensive.

Non-woven fabric is less preferred, because fibres are usually covered with chemicals/adhesives to make the non-woven fabric.

In selecting a woven glass fabric, several basic variables must be considered:

(1) the glass composition: it is not required to use another glass than the common "E" (electrical) type, having as typical composition 52-60 wt % silica, 16-25 wt % calcium oxide, 12-16 wt % alumina, 8-13 wt % boron oxide, 0-1 wt % sodium and potassium oxide, and 0-6 wt % magnesium oxide;

(2) the composition of the yarn: it is preferred that the yarn be composed of continuous filaments ("C");

(3) the average filament diameter: it is indicated in the art as a figure expressed in um; values of 4-10 can be used, values of 7-9 being preferred;

(4) the strand count: this is indicated in the art as a figure expressed in 100 yd/lb (1 yd=0.9144 m; 1 lb=0.454 kg); values of 25-50 are preferred;

(5) the weave pattern: plain weave is preferred;

(6) the fabric finish: woven glass fabric can be used with no finish, but when larger openings are desired, it becomes useful to have some weave lock applied of the fibres to improve dimensional stability; the weave lock material is selected to be chemically compatible with the encapsulating material used in the preparation of the solar panels.

The mesh openings in the insulating layer should be small with respect to the size of the contact points and of the connectors, but large enough for the solder or conductive adhesive to flow through the openings. This is easily done with a simple and quick test. The openings need not be symmetrical, and can e.g. be rectangular or irregular like in the case of chopped fibre tissue.

Once the back of the cell is covered with the fabric layer, a connector has to be applied over each row of contact points.

Figure 6:
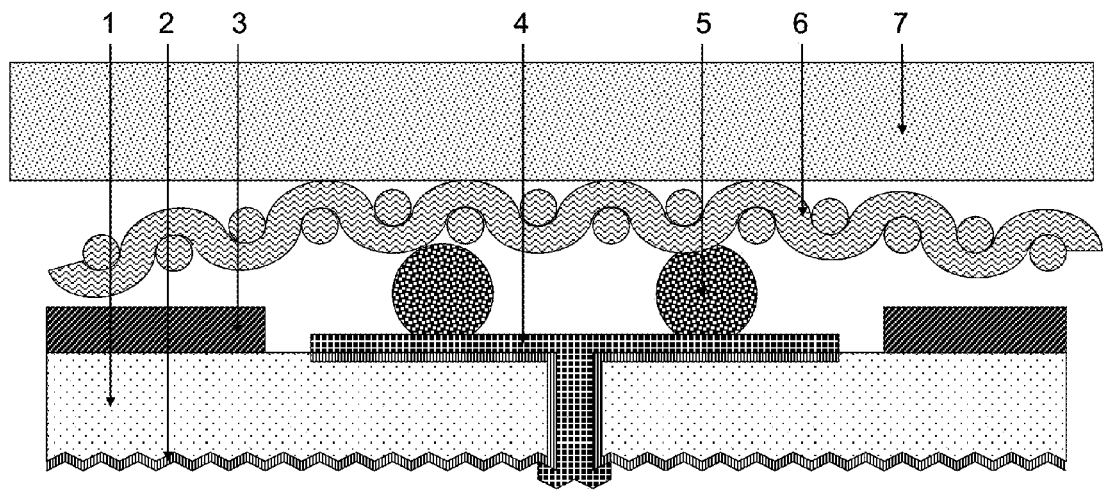
Figure 7:
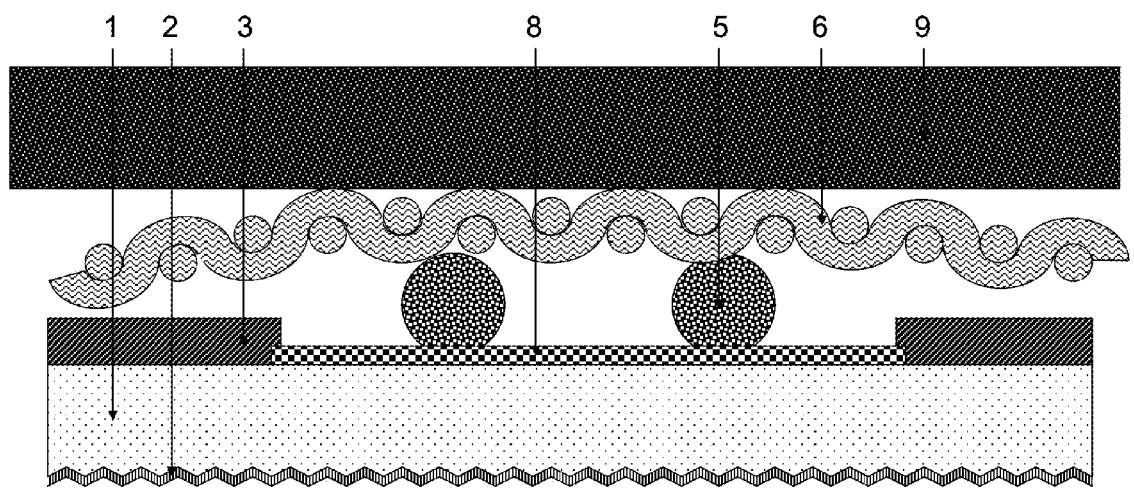

FIGS. 6 and 7 show the same cross-section views as respectively FIGS. 4 and 5 after laying a layer 6 of woven glass fibre over the back side of the cell then a connector (respectively 7 and 9, depending on their polarity) over the row of contact points.

The connectors are standard solderable connectors. It is preferred that they be covered with a thin layer of solder to ensure optimal soldering. As long known in the art, connectors may be provided with expansion bends so that the cells will not be subject to stress after the soldering step. At least the surface area covered by the connectors should be covered by fabric layer before applying the connectors on the back side of the cell.

Figure 8:
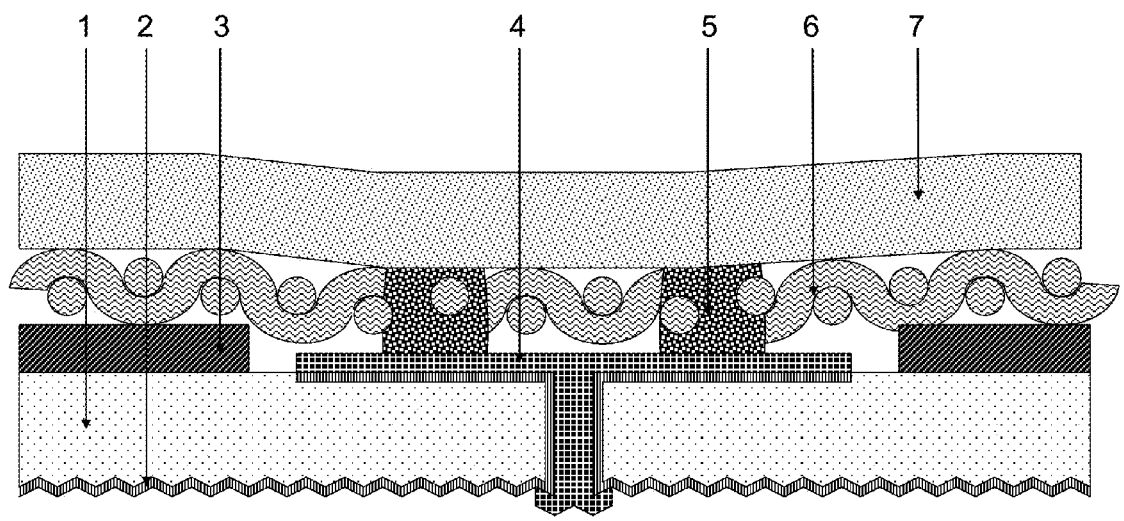
Figure 9:
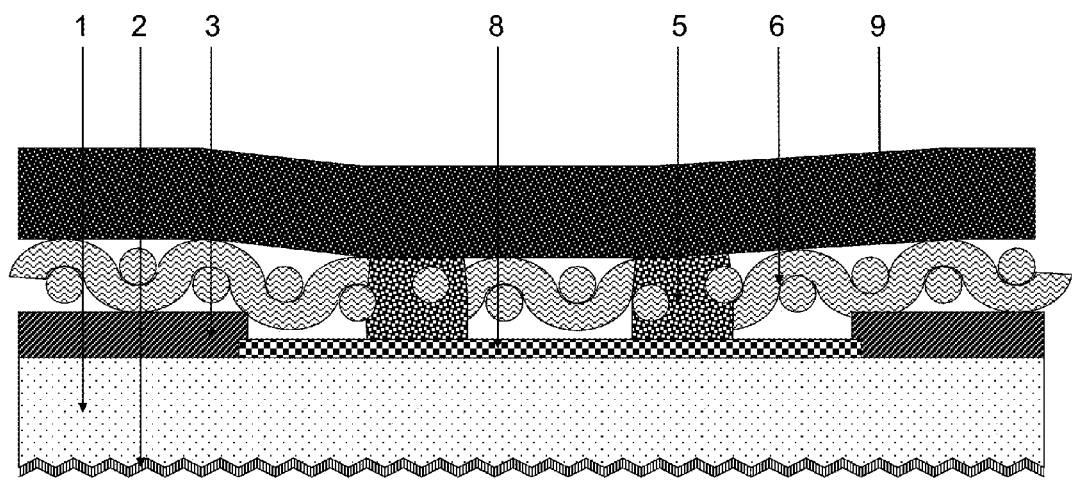

FIGS. 8 and 9 show the same cross-section views as respectively FIGS. 6 and 7 after soldering. It can be seen that the solder 5 when molten flowed through the woven glass fibre fabric 6 and now electrically connects the contact point respectively 4 and 8 to the connector respectively 7 and 9. On places where no solder paste has been applied and soldering step took place, the fabric will serve as an insulating material and as a spacer, avoiding shortcuts and undesired electrical connections. It is clear from the figures that the fabric has remained physically unaffected by the soldering process; in other words, it is the fabric itself that continues to keep the connector spatially separated from the back of the cell.

According to other embodiments of the invention, the fabric can be applied first, and the drops of solder paste applied on the fabric respectively on the connector before positioning the connector and soldering.

According to other embodiments of the invention, there can be used, a conductive adhesive (typically a metal-containing paste requiring heat curing) or an anisotropic paste (typically requiring compression and heat curing) instead of solder paste, which can also be applied before or after the fabric. In such cases, it is also important that the insulating material should remain chemically inert and physically unaffected during the contacting step.

Figure 10:
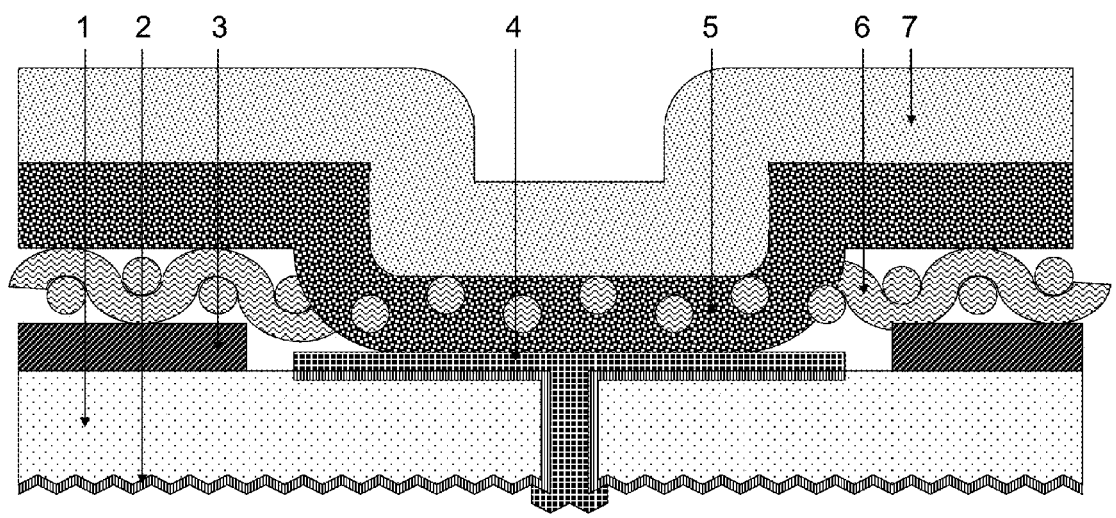

According to yet another embodiment of the invention, it is possible to use connectors provided with a thick layer of solder. When the layer is thick enough, the solder will melt through the fabric during the soldering step and connect the connector with the contact points. This requires however that the connector be previously embossed, so that only the surface to be soldered is physically in contact with the fabric. As an example, FIG. 10 shows the same cross-section as FIG. 8, with the difference that the connector 7 has been embossed so that the molten solder 5 could melt through the fabric 6 only where an electrical contact with the contact point 4 is desired (i.e. where the connector is pressed against the cell and heated). It is however important to keep a layer of insulating material over the back of the cell, because it will serve to keep the connector 6 electrically separated from the area 3 during the later handling steps. FIG. 10 illustrates the case of a connector provided with a thick layer of solder on one side only, which could be provided with a thin layer of solder (not shown) on the other side if desired for reasons not linked to the invention.

Figure 11:
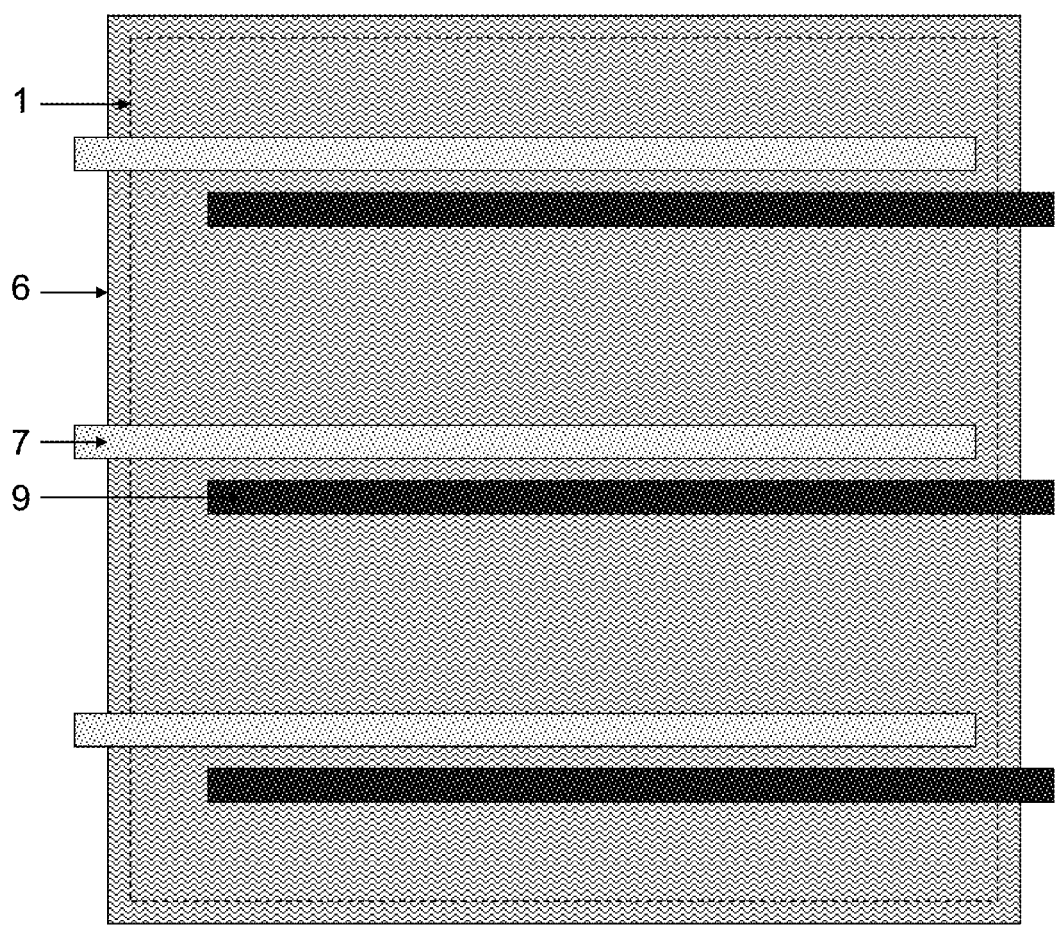

FIG. 11 shows the back of the MWT-type back-contact cell equipped with its connectors 7 and 9 of opposite polarities.

During the later lamination of the cell into a solar panel comprising several cells, the encapsulation material (typically EVA, silicone, thermoplastic polyolefin or other suitable encapsulation material known in the art) will embed the fabric, and the fabric which will provide additional dimensional stability and reinforcement to the solar panel. The encapsulation and the material used have no significant effect on the invention.

Whilst the invention has been described with reference to the preferred embodiment, it can also be used for soldering connectors in EWT or IBC type cells, wherein the connectors have to be electrically connected to areas of one polarity whilst being electrically insulated from the neighbouring areas of the opposite polarity. Using a layer of insulating material as described above avoids having to make holes at predefined locations in some insulating material and to position the latter with high precision.

EXAMPLES

All evaluations were carried out under the standard conditions according to IEC 61853 (Photovoltaic Module Performance Testing and Energy Rating) on the laminate (EVA encapsulant and solar grade glass, with a protective foil on the back side).

Example 1

Figure 12:
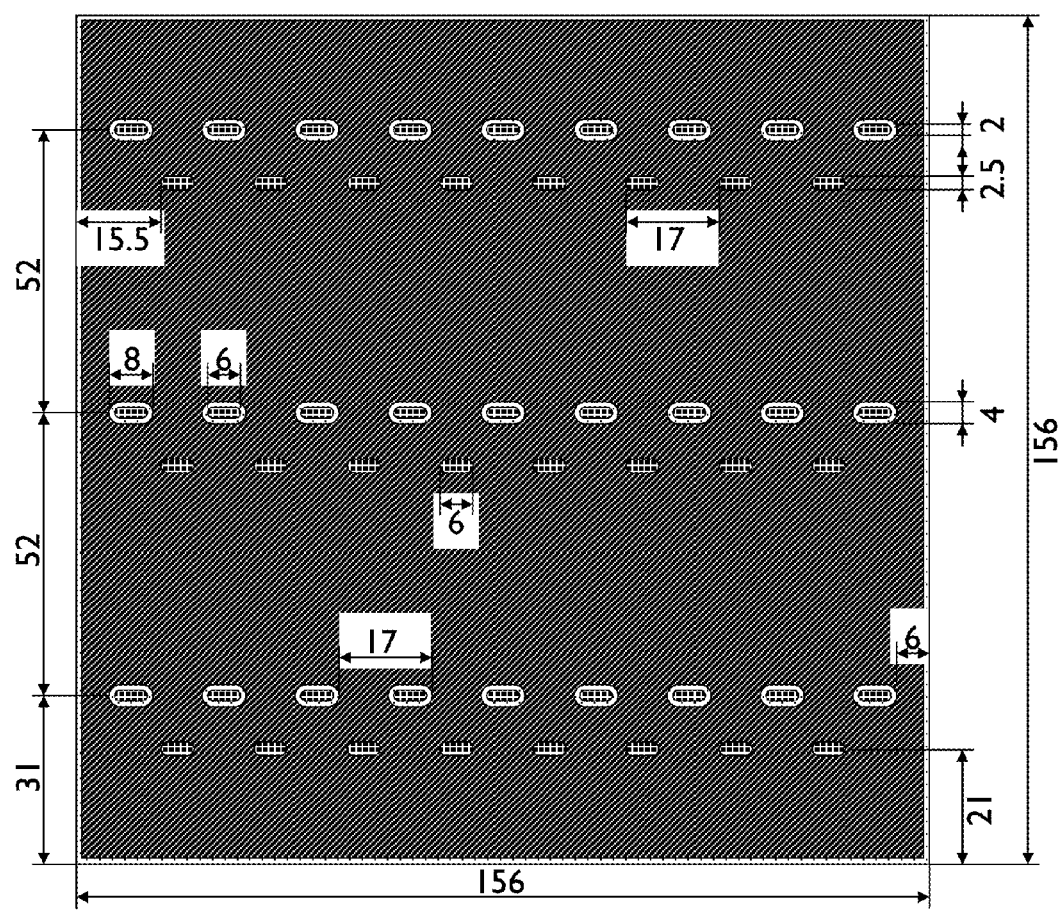
FIG. 12 shows the dimensions of a MWT-type back-contact cell and the location of the contact points.

A MWT back-contact cell was prepared from a multi-crystalline silicon wafer according to the preferred embodiment of the process described in WO 98/54763. FIG. 12 shows the non-illuminated face of the 156 mm×156 mm cell with six rows of contact points. The contact points had a rectangular shape with rounded ends, as shown: the contact points connected to the illuminated face were 2 mm wide and 6 mm long, surrounded by a 1 mm wide non-metallised area, whilst the contact points connected to the charged area of the non-illuminated face were 2.5 mm wide and 6 mm long. Starting from the top (as shown on FIG. 12), the non-illuminated face was provided with a row of 9 contact points, one every 17 mm, connected to the illuminated face, then a row of 8 contact points connected to the charged area of the non-illuminated face, also every 17 mm, this arrangement being repeated a further two times.

The fill factor and the shunt resistance of this cell were measured on a probing station having appropriate contact points.

On each contact point, there were deposited two 1.8 mm diameter drops of solder paste, said 1.8 mm diameter having been determined in a separate experiment to give a 0.9 mm diameter bump after heating. The solder paste was obtained from EFD under the name NC-D501A: it consisted of a NC (No Clean) flux basis containing Sn62 Pb36 Ag2 alloy powder of 45-75 um size. The solder paste was selected to be adapted to soldering to the alloy covering the connectors and to resist to the later step of lamination. The total weight of solder paste on the cell was 0.27 g after deposition or 0.23 g after drying.

The non-illuminated face was then covered with a layer of woven glass fabric. The glass fabric was obtained from Porcher Industries under reference style 3449. It is a plain weave fabric, with EC9 68 yarn and a count/cm of 11.8±0.3 (warp) and 3.5±0.3 (chain) (according to ISO 7211-2), with finish 094 (black), having a relative weight of 111±6 g/m2 (measured according to ISO 3374).

A connector consisting of a 100 um thick and 3 mm wide strip of copper covered with a 30 um layer of Sn solder was laid over each of the six rows of contact points. The cell was heated to 150° C. A solder tip at a temperature of 270° C. was then applied on top of each contact point with light hand pressure to ensure good contact between the layers.

Figure 13:
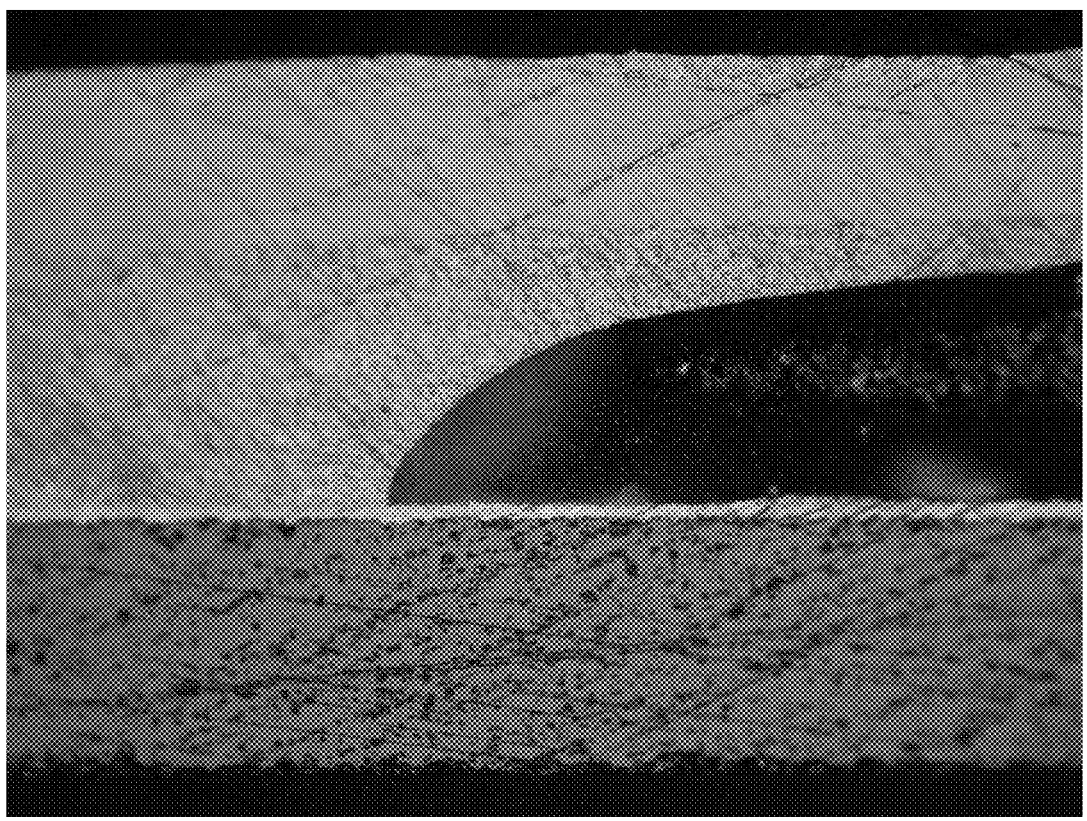
FIG. 13 shows a picture of a cross-section through a contact point to the back surface after soldering.

FIG. 13 shows a picture of a cross-section through a contact point to the back surface, after soldering. The picture roughly corresponds to the portion comprised between the arrows 5 and 6 on FIG. 8 or 9. The connector can be seen on the top, with a layer of solder on both sides. It is well separated from the surface of the cell except on the left side of the picture, where the solder is seen to link the connector to the contact point (the picture shows the contact point as a layer of silver on top of the 180 um thick silicon wafer).

On the right of the picture, the layer of glass fibre can be seen between the connector and the contact point, spatially keeping them separated.

The resulting (encapsulated) cell was evaluated electrically by comparing the fill factor and the shunt resistance of the resulting cell with the fill factor and shunt resistance measured previously (using a probing station) on the cell as initially obtained; the loss was of about 2.5% of Fill Factor and 1% of Shunt Resistance.

Example 2

Example 1 was repeated until application of the woven glass fabric.

A connector consisting of a 80 um thick and 6 mm wide strip of copper covered with a 9 um layer of Sn—Pb—Ag solder (62-36-2 wt %) was laid over each of the six rows of contact points. The cell was heated to 170° C. A solder tip at a temperature of 240° C. was then applied on top of each contact point with light pressure to ensure good contact between the layers.

22 identical cells were prepared and connected in series to form a module. The evaluation of the module gave the following results:

| | | |
|---|---|---|
| Uoc (V) | 13.442 | (open circuit) |
| Isc (A) | 8.502 | (short circuit) |
| Ump (V) | 10.875 | (maximum power) |
| Imp (A) | 7.829 | |
| Pmax (W) | 85.141 | |
| Fill Factor | 74.50% | |

The high value for the fill factor demonstrates that the invention is providing both excellent electrical insulation and electrical connection.

Example 3

Example 2 was repeated, using mono-crystalline silicon wafers, except for the total weight of solder paste on the cell which was of 0.45 g after drying, until application of the woven glass fabric.

A connector consisting of a 80 um thick and 6 mm wide strip of copper covered with a 9 um layer of Sn—Ag solder (97-3 wt %) was laid over each of the six rows of contact points. The cell was heated to 170° C. A solder tip at a temperature of 250° C. was then applied on top of each contact point with light pressure to ensure good contact between the layers.

22 identical cells were prepared and connected in series to form a module. The evaluation of the module gave the following results:

| | | |
|---|---|---|
| Uoc (V) | 13.79 | (open circuit) |
| Isc (A) | 8.78 | (short circuit) |
| Pmax (W) | 92.05 | |
| Fill Factor | 76.04% | |

The high value for the fill factor demonstrates that the invention is providing both excellent electrical insulation and electrical connection.

Example 4

Example 1 was repeated until application of the woven glass fabric.

A connector consisting of a 150 um thick and 6 mm wide strip of copper-zinc alloy (99.5-0.5 wt %) was laid over each of the six rows of contact points. The cell was heated to 160° C. A solder tip at a temperature of 300° C. was then applied on top of each contact point with light pressure to ensure good contact between the layers.

| | |
|---|---|
| Fill Factor | 75.94% |
| Rsh (ohm) | 44.89 (shunt) |
| Efficiency | 16.11% |

The high value for the fill factor demonstrates that the invention is providing both excellent electrical insulation and electrical connection.

Example 5

Example 1 was repeated, except for the total weight of solder paste on the cell which was of 0.34 g after drying, until application of the woven glass fabric, which was a 22×136tex texturised 8 yarns/cm fabric with finish 094 (black).

A connector consisting of a 80 um thick and 6 mm wide strip of copper covered with a 9 um layer of Sn—Ag solder (97-3 wt %) was laid over each of the six rows of contact points. The cell was heated to 170° C. A solder tip at a temperature of 250° C. was then applied on top of each contact point with light pressure to ensure good contact between the layers.

The cell was evaluated:

| | | |
|---|---|---|
| Uoc (V) | 0.613 | (open circuit) |
| Isc (A) | 8.758 | (short circuit) |
| Ump (V) | 0.495 | (maximum power) |
| Imp (A) | 8.066 | |
| Pmax (W) | 3.99 | |
| Fill Factor | 74.34% | |
| Rsh (ohm) | 37.76 | (shunt) |

The high value for the fill factor demonstrates that the invention is providing both excellent electrical insulation and electrical connection.

Example 6

A MWT back-contact cell was prepared as described in Example 1.

On each contact point, there were deposited two 2 mm diameter drops of solder paste, said 2 mm diameter having been determined in a separate experiment to give a 1 mm diameter bump after heating. The solder paste was obtained from EFD: it consisted of a NC (No Clean) flux basis containing Sn43 Pb43 Bi14 alloy powder of 45-75 um size. The solder paste was selected to be adapted to soldering to the alloy covering the connectors and to resist to the later step of lamination.

The non-illuminated face was then covered with a layer of woven glass fabric. The glass fabric was obtained from Porcher Industries under reference 962. It is a plain weave fabric, with EC9 34 yarn and a count/cm of 15.5±0.5 (warp) and 15.0±0.5 (chain) (according to ISO 7211-2), with no finish, having a relative weight of 106±5 g/m2 (measured according to ISO 3374).

A connector consisting of an 80 um thick and 6 mm wide strip of copper covered with a 30 um layer of Sn62 Pb36 Ag2 solder was laid over each of the six rows of contact points. A solder tip at a temperature of 270° C. was then applied on top of each contact point with light hand pressure to ensure good contact between the layers.

The resulting cell was evaluated electrically by comparing the fill factor and the shunt resistance of the resulting cell with the fill factor and shunt resistance measured previously on the cell as initially obtained; the loss was of about 1% in both cases.

Example 7

A MWT back-contact cell was prepared as described in Example 1.

On each contact point, there was deposited a drop of solder paste. The total weight of solder paste on the cell was of 0.48 g after drying. The solder paste was obtained from EFD under the name NC-D501: it consisted of a NC (No Clean) flux basis containing Sn62 Pb36 Ag2 alloy powder of 45-75 um size.

The non-illuminated face was then covered with a layer of non-woven glass fabric surfacing veil. The glass fabric was obtained from Viledon under reference T1785. It is a chopped fibre fabric, with E-glass fibre (according to DIN 60-001-T1), having a relative weight of 14 g/m2 (measured according to EN 29 073-T1) and a thickness of 0.17 mm (measurement according to EN 29 073-T2).

A connector consisting of an 80 um thick and 6 mm wide strip of copper covered with a 9 um layer of Sn—Ag solder (97-3 wt %) was laid over each of the six rows of contact points. The cell was heated to 170° C. A solder tip at a temperature of 255° C. was then applied on top of each contact point with light pressure to ensure good contact between the layers.

The resulting cell was evaluated electrically:

| | |
|---|---|
| Uoc (V) | 0.613 (open circuit) |
| Isc (A) | 8.60 (short circuit) |
| Fill Factor | 75.74% |
| Rsh (ohm) | 84.25 (shunt) |
| Ncell | 16.40% |

Example 8

Example 1 was repeated, using mono-crystalline silicon wafers, except for the total weight of solder paste on the cell which was of 0.45 g after drying, until application of the woven glass fabric. The glass fabric was a 22×136tex texturised 8 yarns/cm fabric with finish 094 (black).

The glass fabric layer as applied on each cell string, consisting of 11 cells. The fabric density was denser outside the cell area, in order to cover the connectors in the space between the cells.

A connector consisting of a 80 um thick and 6 mm wide strip of copper covered with a 9 um layer of Sn—Ag solder (97-3 wt %) was laid over each of the six rows of contact points. The cells were heated to 170° C. A solder tip at a temperature of 250° C. was then applied on top of each contact point with light pressure to ensure good contact between the layers.

22 identical cells were prepared in 2 strings of 11 cells and connected in series to form a module. The evaluation of the module gave the following results:

| | |
|---|---|
| Uoc (V) | 13.81 (open circuit) |
| Isc (A) | 8.87 (short circuit) |
| Pmax (W) | 94.71 |
| Fill Factor | 77.34% |

The high value for the fill factor demonstrates that the invention is providing both excellent electrical insulation and electrical connection. The dense fabric outside the cell area gave a uniform black appearance to the module after lamination.

The invention claimed is:

1. A back-contact solar cell, comprising:
   two oppositely doped regions, having contact points placed on a non-illuminated surface of the solar cell; and
   connectors to collect current from the contact points,
   wherein the connectors are spatially separated from the non-illuminated surface by a uniform layer of insulating fabric material, and an electrical connection electrically connecting the connectors to the contact points through the insulating fabric material,
   the electrical connection between the contact points and the connectors embedding the insulating fabric material,
   wherein the insulating fabric material is uniformly formed over an area of the back-contact solar cell where the contact points are located.

2. The back-contact solar cell according to claim 1, wherein the back-contact solar cell is further of a type selected from the group consisting of the metal wrap-through (MWT) type, the interdigitated back-contact (IBC) type, and the emitter wrap-through (EWT) type.

3. The back-contact solar cell according to according to claim 1, wherein the insulating fabric material is selected from woven or non-woven fabric of fibrous material.

4. The back-contact solar cell according to according to claim 1, wherein the insulating fabric material is a woven glass fibre fabric.

5. A process for connecting ohmic contacts of a back-contact solar cell to external connectors, comprising the steps of:
   providing a solar cell wherein contact points to the two oppositely doped regions are placed on a non-illuminated surface of the solar cell;
   laying a uniform layer of insulating fabric material;
   laying at least one electrical connector over one or more contact points of one polarity and at least one electrical connector over one or more contact points of the other polarity, each contact point facing an electrical connector, the electrical connector being spatially separated by the insulating fabric material from the non-illuminated surface including the contact points; and
   electrically connecting each contact point to the connector facing it through the layer of insulating fabric material spatially separating them, the electrical connection embedding the insulating fabric material,
   wherein the insulating fabric material is uniformly formed over an area of the back-contact solar cell where the contact points are located.

6. The process according to claim 5, wherein the electrical connection is made whilst keeping the contact points spatially separated from the connectors by the layer of insulating fabric material.

7. The process according to claim 5, wherein the solar cell is of a type selected from the group consisting of the MWT type, the IBC type and the EWT type.

8. The process according to claim 5, wherein the insulating fabric material is selected from woven or non-woven fabric of fibrous material.

9. The process according to claim 5, wherein the electrical connection is made using electrically conductive material selected from solder, solder paste, conductive adhesive, anisotropic conductive paste and combinations thereof, and the process comprises at least one step selected from i) applying the electrically conductive material on each contact point before laying the layer of insulating fabric material, and ii) applying the electrically conductive material over each contact point after laying the layer of insulating fabric material.

10. The back-contact solar cell according to according to claim 1, wherein the electrical connection is formed of an electrically conductive material flown through mesh openings in the insulating fabric material.

11. The process according to claim 8, wherein the insulating fabric material is a woven glass fibre fabric.

\* \* \* \* \*